(12) United States Patent
Skotnicki et al.

(10) Patent No.: US 6,642,108 B2
(45) Date of Patent: Nov. 4, 2003

(54) FABRICATION PROCESSES FOR SEMICONDUCTOR NON-VOLATILE MEMORY DEVICE

(75) Inventors: Thomas Skotnicki, Crolles Montfort (FR); Didier Dutartre, Meylan (FR); Pascal Ribot, La Grande Combe (FR); Maryse Paoli, Villard Bonnot (FR); Richard Fournel, Lumbin (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/273,925

(22) Filed: Oct. 18, 2002

(65) Prior Publication Data

US 2003/0038315 A1 Feb. 27, 2003

Related U.S. Application Data

(62) Division of application No. 09/814,177, filed on Mar. 21, 2001, now abandoned.

(30) Foreign Application Priority Data

Mar. 29, 2000 (FR) .............................................. 00 03983

(51) Int. Cl.$^7$ ............................................. H01L 21/336
(52) U.S. Cl. ........................ 438/257; 438/263; 438/264; 438/266; 438/211
(58) Field of Search ................................. 438/257, 258, 438/259, 260, 261, 263, 264, 265, 266, 211

(56) References Cited

U.S. PATENT DOCUMENTS

| 4,523,213 | A |  | 6/1985 | Konaka et al. ............ 357/23.7 |
|---|---|---|---|---|
| 5,488,244 | A |  | 1/1996 | Quek et al. .................. 257/314 |
| 5,518,943 | A |  | 5/1996 | Tsunoda ....................... 437/43 |
| 5,773,343 | A |  | 6/1998 | Lee et al. .................... 438/259 |
| 5,973,352 | A | * | 10/1999 | Noble ......................... 438/212 |
| 5,990,515 | A |  | 11/1999 | Liu et al. ..................... 257/316 |
| 6,060,358 | A |  | 5/2000 | Bracchitta et al. .......... 438/259 |
| 6,362,050 | B2 | * | 3/2002 | Kalnitsky et al. ........... 438/258 |
| 6,368,911 | B2 |  | 4/2002 | Fu .............................. 438/248 |
| 6,518,072 | B1 | * | 2/2003 | Huster et al. ............... 438/261 |

FOREIGN PATENT DOCUMENTS

| DE | 19811080 | 9/1999 |
|---|---|---|
| EP | 0233791 | 8/1987 |
| JP | 61-144879 | 7/1986 |

OTHER PUBLICATIONS

Patent Abstracts of Japan, vol. 010, No. 340 (E–455), Nov. 18, 1986 & JP61144879A (Toshiba Corp) Jul. 2, 1986.
Patent Abstracts of Japan, vol. 013, No. 184 (E–751) Apr. 28, 1989 & JP01010673A (Fujitsu Ltd; Others: 01) Jan. 13, 1999.
Patent Abstracts of Japan, vol. 015, No. 147 (E–1055), Apr. 12, 1991 & JP03022485A (NEC Corp) Jan. 30, 1991.
Patent Abstracts of Japan, vol. 1998, No. 04, Mar. 31, 1998 & JP 09330988A (Sony Corp) Dec. 22, 1997.

* cited by examiner

*Primary Examiner*—Kevin M. Picardat
(74) *Attorney, Agent, or Firm*—Lisa K. Jorgenson; Allen, Dyer, Doppelt, Milbrath & Gilchrist, P.A.

(57) ABSTRACT

A non-volatile memory includes a floating gate extending in a substrate between source and drain regions. A channel region may be confined by two insulating layers. The invention is particularly applicable to EPROM, EEPROM, Flash and single-electron memories using CMOS technology.

20 Claims, 9 Drawing Sheets

FABRICATION PROCESSES FOR SEMICONDUCTOR NON-VOLATILE MEMORY DEVICE

This application is a divisional of Ser. No. 09/814,177 tiled on Mar. 21, 2001, now abandoned, the disclosures of which are hereby incorporated by reference in their entirety.

FIELD OF THE INVENTION

The present invention relates to the field of integrated circuits, and, more particularly, to semiconductor non-volatile memory devices including complementary metal oxide semiconductor (CMOS) technology and related fabrication processes.

BACKGROUND OF THE INVENTION

Non-volatile memories store charge on a floating gate, i.e., a gate not connected outside the device. The mode of injection or erasure of this charge depends on the type of memory in question. The control potential on the floating gate is induced by a capacitively coupled control gate. The charge may be injected or erased many times without appreciably damaging the structure. When the charge is stored on the floating gate, it can remain there a very long time (apart from leakage currents) without being impaired. This storage is said to be "non-volatile."

Among the non-volatile memories, mention is made here of erasable and programmable read-only memories (EPROMs) and electrically erasable and programmable read-only memories (EEPROMs), as well as the so-called "Flash EPROMs" or "Flash EEPROMs". Depending upon the type of non-volatile memory, charge is introduced into the floating gate either by the injection of hot carriers from the channel of the transistor or by forcing conduction through the oxide. This modifies the threshold voltage of the transistor. To discharge the floating gate (i.e., to erase the contents of the memory), either illumination by ultraviolet radiation is used (e.g., in an EPROM memory), thereby making the oxide conducting, or a discharge by a tunnel effect is used.

Figure 1:
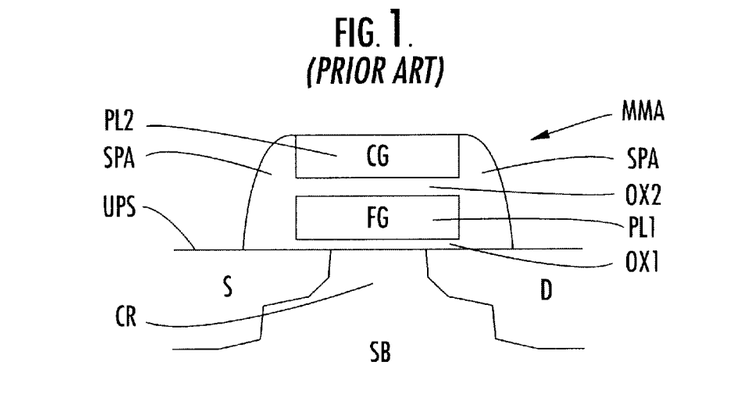
FIG. 1 (previously described) is a cross-sectional view of a non-volatile point memory according to the prior art.

A non-volatile point memory MMA according to the prior art is illustrated in FIG. 1. The memory device MMA has two polysilicon levels PL1 and PL2 above the upper surface UPS of the substrate SB. These levels PL1, PL2 form the floating gate FG and the control gate CG, respectively, of the memory device. The floating gate FG is electrically isolated from the source region S, the drain region D, and the channel region CR by a first oxide layer OX1. The floating gate and the control gate are mutually electrically isolated by a second oxide layer OX2. Lateral isolating regions or spacers SPA complete the electrical isolation of the two gates, especially that of the floating gate FG. The use of two levels of polysilicon has drawbacks, especially from the standpoint of integrating a point memory therewith in a more complex structure using CMOS technology.

SUMMARY OF THE INVENTION

An object of the invention is to provide a non-volatile memory device using only a single polysilicon level above the surface of the substrate.

According to the invention, a semiconductor non-volatile memory device includes a silicon-based semiconductor substrate including source and drain regions, a control gate, and a floating gate. The floating gate extends between the source and drain regions formed in the substrate, and the control gate lies above the floating gate. In other words, whereas in the prior art the floating gate is above the source and drain regions, in this case it is "buried" in the substrate. Thus, only a single polysilicon level above the upper surface of the substrate is required to form the control gate.

More specifically, the substrate has a lower part or portion lying beneath the source and drain regions and a channel region lying above the lower part of the substrate between the source and drain regions. The floating gate may be formed from a semiconductor region overdoped with respect to the channel region. The semiconductor region lies above the channel region and is isolated therefrom and from the source and drain regions by an insulating layer.

The non-volatile memory device may also include an additional insulating layer between the channel region and the lower part of the substrate. Thus, the channel of the MOS transistor is bounded by two isolating regions, thereby making it possible to obtain narrow and confined channels. This gives the channels great robustness, as opposed to the drawbacks associated with the effects of short channels.

Apart from the fact that the floating gate is buried in the initial surface of the silicon wafer, it is advantageously a single-crystal silicon gate. The floating gate may be longer than the control gate in the channel direction. Further, it may be confined, in a perpendicular direction, to the width of the active region. This is not the case with the control gate.

A method aspect of the invention is for fabricating a semiconductor non-volatile memory device and includes forming a first layer of a material on an initial silicon substrate. The first layer is surrounded by an isolating peripheral region and may be removed selectively with respect to the silicon. The first layer may comprise a silicon-germanium alloy, for example. Further, a silicon second layer is formed on the first layer and overdoped (e.g., in situ or by implantation) with respect to the initial substrate, and a gate oxide layer is formed on the second layer. A control gate is formed on the gate oxide layer and contacts, at opposing ends thereof, the isolating peripheral region. Additionally, the gate oxide layer, the second layer, the first layer, and an upper part of the initial substrate are etched along two opposed sidewalls of the gate to form cavities. The first layer is selectively etched to form a tunnel between the second layer and the initial substrate, and an insulating layer is formed on the walls of the second layer and in at least part of the tunnel. Further, the cavities may be filled with silicon, and the source and drain regions may be formed in the filled cavities, on each side of the second layer, to form a floating gate.

More specifically, forming the insulating layer may include coating the walls of the tunnel with the insulating layer, where the inside of the tunnel is empty. Alternatively, forming the insulating layer may include completely filling the tunnel with the insulating layer. Either way, forming the insulating layer may also include forming the insulating layer in the bottom of the cavities. In this case, that part of the insulating layer formed in the bottom of the cavities is removed before filling the cavities with silicon. Further, that part of the insulating layer formed in the bottom of the cavities may be removed by anisotropic etching or by chemical etching in a wet bath.

It is also advantageous, before oxidizing the tunnel, to implant selected ions into the bottom of the cavities (e.g., nitrogen ions) to retard the oxidation of the silicon. Thus, a thinner insulating layer is obtained in the bottom of the cavities after the insulating step than inside the tunnel. In this way, it will be possible after the insulating step to maintain an insulating layer on the lower wall of the tunnel. This makes it possible to obtain a point memory whose channel is confined by two oxide layers. Additionally, the silicon may be grown by selective epitaxy during the cavity-filling step. The silicon may optionally fill the inside of the tunnel (if the tunnel has not otherwise been completely filled with oxide).

BRIEF DESCRIPTION OF THE DRAWINGS

Further advantages and characteristics of the invention will become apparent upon examination of a detailed description of embodiments and methods of implementation, which are given by way of non-limitative example, and the appended drawings, in which.

DETAILED DESCRIPTION OF THE PREFERRED EMBODIMENTS

Figure 2:
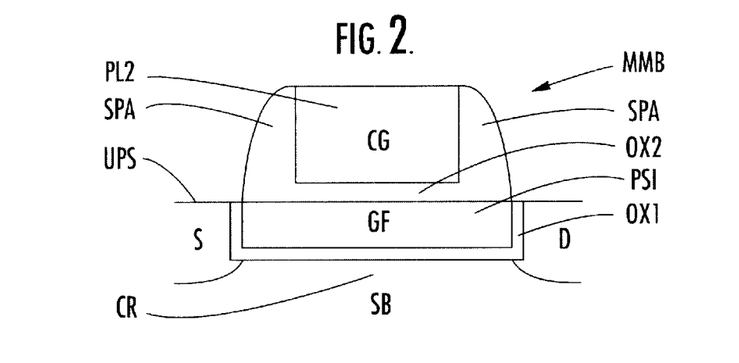
FIG. 2 is a cross-sectional view of one embodiment of a non-volatile memory device according to the invention.

Turning now to FIG. 2, a first embodiment of a non-volatile memory device MMB has a floating gate FG "buried" in a substrate SB. This floating gate FG is formed from a silicon layer PSI and is isolated from the adjacent channel region CR and from the source and drain regions S and D by an insulating layer OX1, for example, formed from $SiO_2$. This floating gate FG extends between the source and drain regions which are formed in the substrate and beneath the upper surface UPS of the substrate SB. Moreover, the floating gate FG is isolated from the control gate CG by a second gate oxide OX2. This control gate is flanked by two spacers SPA and is above the source and drain regions. A person skilled in the art will therefore have noticed that the structure according to the invention requires only a single polysilicon level PL above the substrate.

Figure 3:
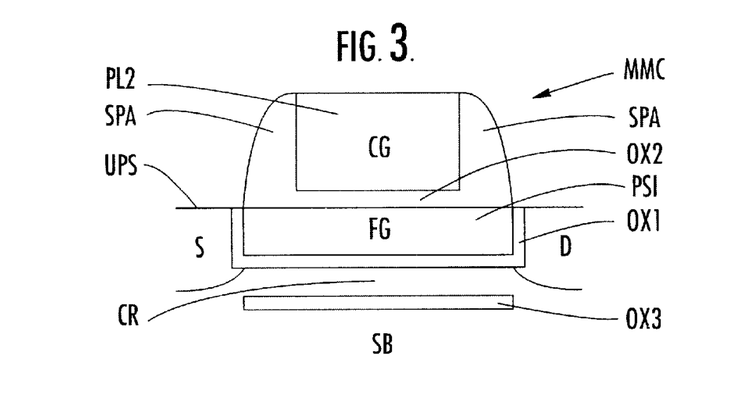
FIG. 3 is a cross-sectional view of another embodiment of a non-volatile memory device according to the invention.

Referring to FIG. 3, another embodiment of a memory device MMC according to the invention is shown. The sole difference between the device MMC and the device MMB illustrated in FIG. 2 is that the channel region CR of the device MMC is not only confined in its upper part by the oxide OX1 but is also confined in its lower part by an additional insulating layer OX3. A very narrow channel is therefore obtained which is particularly robust compared to short-channel effects.

Figure 4:
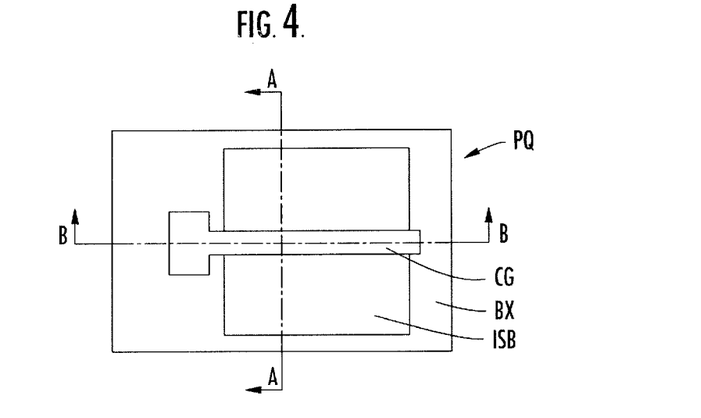
FIG. 4 is a top plan view of a memory device according to the invention.

Methods of fabricating the two embodiments illustrated in FIGS. 2 and 3 will now be described in greater detail with reference to FIG. 4 et seq. A partial top view of a memory device according to the invention is illustrated in FIG. 4. Within the semiconductor wafer PQ an isolating peripheral region BX has been produced in a conventional manner (e.g., by an shallow trench isolation (STI) process, which will be appreciated by those of skill in the art). This isolating peripheral region BX thus defines a silicon region forming a so-called "initial" substrate ISB within which the memory structure according to the invention will be formed. The control gate CG is also illustrated in FIG. 4.

Figure 5A:
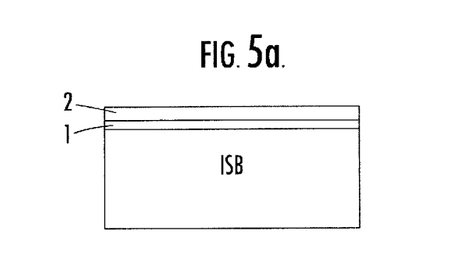
FIGS. 5a, 5b, 6a, 6b, 7a and 8a are cross-sectional views illustrating making of the a memory device of FIG. 4.
Figure 5B:
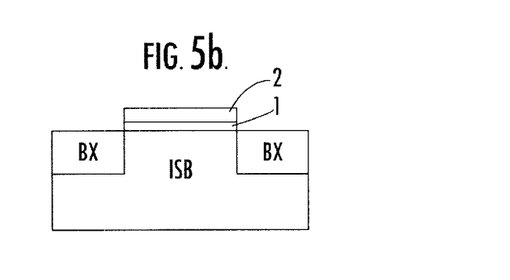

As used in FIG. 5 et seq., the suffix "a" assigned to these figures denotes a section on the line A—A in FIG. 4, while the suffix "b" assigned to a figure denotes a longitudinal section on the line B—B in FIG. 4. Referring to FIGS. 5a and 5b, the process starts by successively depositing a layer of a material 1 on the substrate ISB by selective epitaxy (e.g., by chemical vapor deposition). This layer 1 can be removed selectively with respect to the silicon and generally has a thickness of between 1 and 50 nm. Further, a silicon layer 2 is also formed by epitaxy and has a thickness of, for example, between 1 and 50 nm. The selective nature of the epitaxy means that the materials 1 and 2 grow only on the initial substrate ISB and not on the isolating peripheral region BX.

The material layer 1 that can be removed selectively with respect to the silicon may be any material which, preferably, ensures lattice cell continuity with the silicon of the substrate during the epitaxy. For example, a $Si_{1-x}Ge_x$ alloy where $0 < x \leq 1$ may be used. $Si_{1-x}Ge_x$ alloys are recommended since they can be easily removed selectively, either by a well-known oxidizing chemistry (such as a solution containing 40 ml of 70% $HNO_3$ + 20 ml of $H_2O_2$ + 5 ml of 0.5% HF) or by isotropic plasma etching.

Preferably, $Si_{1-x}Ge_x$ alloys (where $0 < x \leq 1$) having a high germanium content are used since the etching selectivity with respect to silicon increases with increasing content of germanium in the alloy. It is also possible to use $Si_{1-x-y}Ge_xC_y$ alloys (where $0 < x \leq 0.95$; $0 < y < 0.05$) which behave like the $Si_{1-x}Ge_x$ alloys with respect to selective removal but together with the silicon layers induce less strain.

Figure 6A:
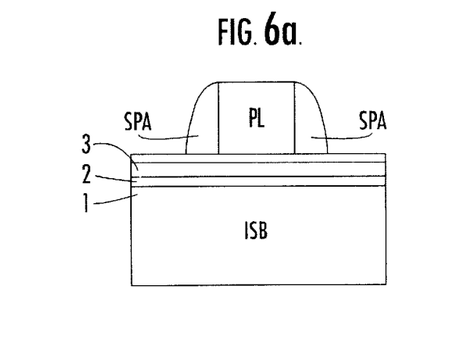
Figure 6B:
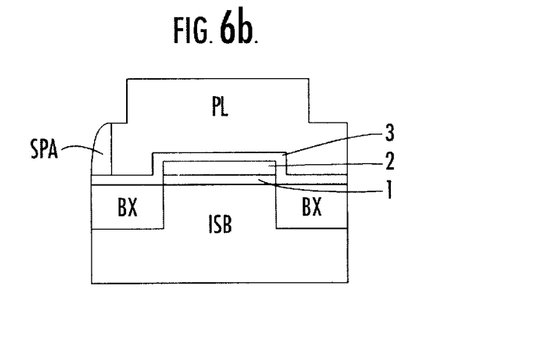

As shown in FIGS. 6a and 6b, the process continues in a conventional manner with the formation of a gate oxide layer 3 (e.g., $SiO_2$) and then a polysilicon layer PL on the gate oxide layer. The polysilicon layer PL is conventionally etched in a known manner to form the active region of the control gate CG. Spacers SPA (e.g., made of silicon nitride $Si_3N_4$) are also conventionally formed on the sidewalls of the polysilicon layer PL.

It should be noted here that, although the polysilicon region PL forms the control gate, the future floating gate of the memory structure according to the invention will be produced in the silicon layer 2. Thus, this silicon epilayer must be highly doped (either in situ or by implantation). By way of example, this doping will be carried out to achieve a dopant concentration on the order of $10^{20}$ atoms/cm$^3$.

Figure 7A:
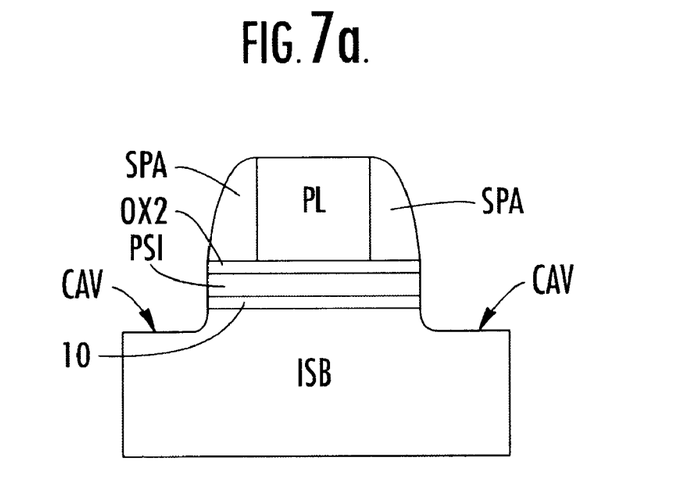

Starting from the structure illustrated in FIGS. 6a and 6b, the process continues (FIG. 7a) with etching (e.g., with a plasma) of the gate oxide layer 3, the silicon layer 2, the layer of selectively removable material 1, and an upper part of the initial silicon substrate ISB on each side of the spacers SPA. This forms two cavities CAV. The remaining portion of the oxide layer 3 will form the gate oxide OX2 of the point memory. Also, the remaining portion of the silicon layer 2 forms a block of single-crystal silicon SCS which will form the future floating gate of the point memory. Further, the reference 10 denotes the remaining portion of the layer of selectively removable material, e.g., silicon-germanium.

Figure 8A:
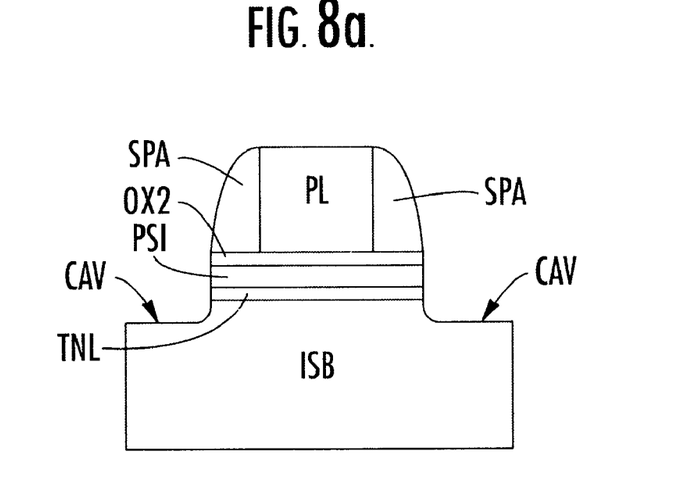

Next, the material of the layer 10 is selectively removed, for example, by the above mentioned oxidizing chemistry. Thus, as illustrated in FIG. 8a, a tunnel TNL is formed instead of the layer 10. It should be noted here that the block of silicon SCS adheres to the gate oxide OX2 and to the lower surface of the polysilicon block PL of the control gate CG which, moreover, rests at its two ends on the isolating peripheral region BX.

FIG. 8a shows the cavities which have a bottom lying below the tunnel TNL. In this case, various depths of the cavities may be used in accordance with the invention as long as the depth is sufficient to allow the layer 10 to be exposed for the purpose of its subsequent removal. However, as seen in FIG. 9 and the following figures, the bottom of the cavities CAV have been shown for the sake of simplification in the extension of the lower wall of the tunnel TNL.

Figure 9:
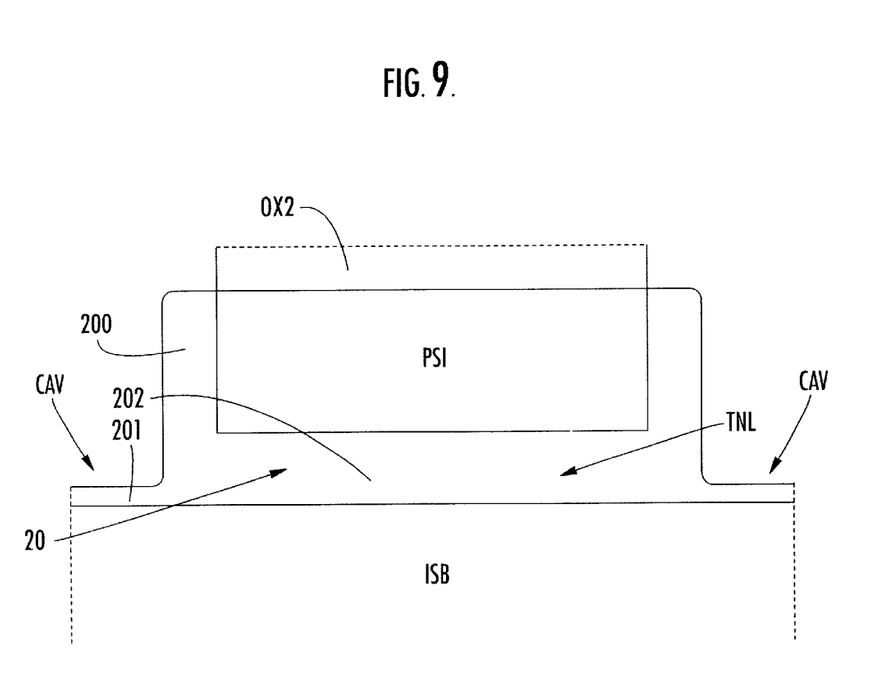
FIGS. 9 to 11 are cross-sectional views illustrating the final steps of a first alternative method according to the invention.
Figure 10:
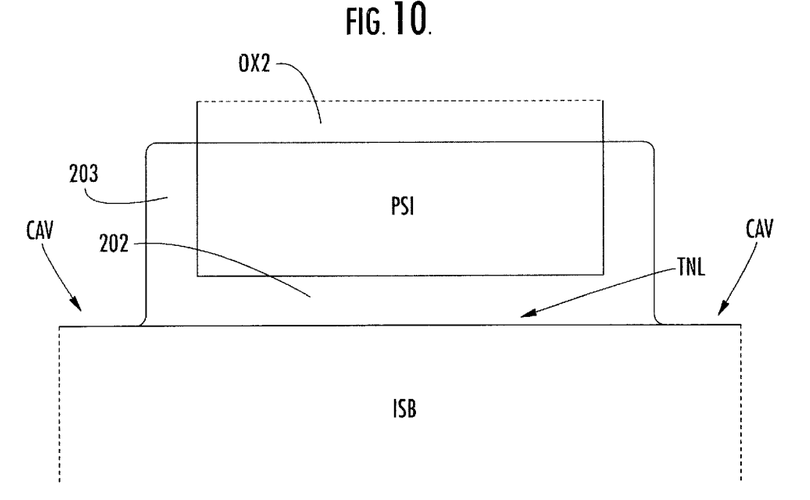
Figure 11:
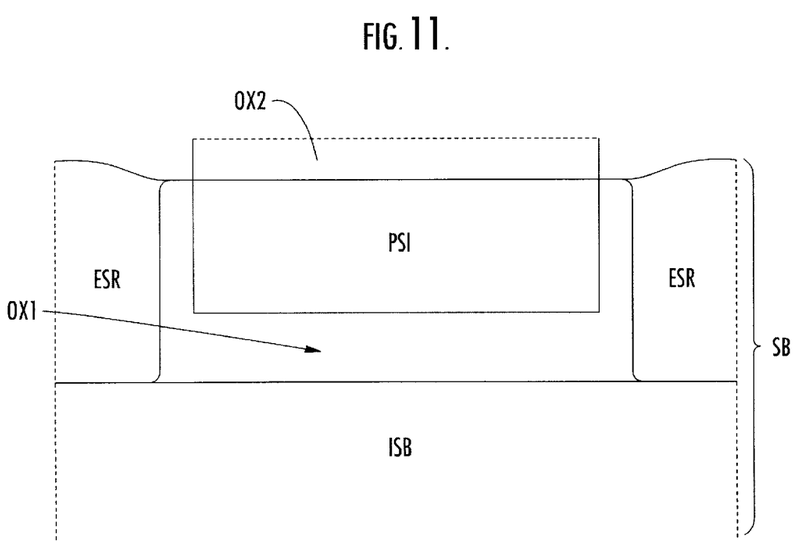

Referring more particularly to FIGS. 9 to 11, a first method of implementing the process according to the invention will now be described. The method provides a memory device structure as illustrated in FIG. 2. The process starts (FIG. 9) with the oxidation of the tunnel TNL. It is assumed that the thickness of the oxide layer and the height of the tunnel TNL have been chosen to completely fill the tunnel TNL with the insulator. This insulating layer, which may be silicon dioxide, for example, is obtained by thermal oxidation, for example. The insulating layer 20 thus formed has a part 202 lying in the tunnel TNL, a part 201 lying in the bottom of the cavities CAV, and a part 200 lying along the vertical sidewalls of the single-crystal silicon block SCS. In this regard, it should be noted that the thickness of the oxide layer 200 is greater than the thickness of the oxide layer 201 which grows on the bottom of the cavities. This greater thickness of the layer 200 is in fact due to growth of an oxide on a highly doped material.

The process then continues (FIG. 10), for example, with anisotropic plasma etching to remove the insulating oxide layer at the bottom of the cavities CAV. It should be noted here that this anisotropic plasma etching does not remove the oxide layer 202 lying in the tunnel since the inside of the tunnel is shielded from the plasma etching. Moreover, even if the thickness of the oxide layer 203 lying on the sidewalls of the block SCS has decreased after the anisotropic etching, some oxide still remains because of the initially greater thickness of the layer 200 compared with the layer 201. FIG. 10 therefore shows that the single-crystal silicon block SCS which will form the future floating gate FG is completely isolated from the substrate ISB, and also from the control gate, by the gate oxide OX2.

The bottoms of the cavities could be deoxidized by chemical etching in a conventional wet bath instead of anisotropic plasma etching. Here again, the configuration illustrated in FIG. 10 would be obtained because of the greater oxide thickness in contact with the overdoped single-crystal silicon block SCS. As illustrated in FIG. 11, the next step includes growing silicon in the cavities using a conventional selective epitaxy process. This epitaxial silicon ESR then rises up to the spacers and coats the single-crystal silicon block SCS.

The implantation of the source and drain junctions on each side of the spacers of the control gate then completes the fabrication process and allows a structure of the type illustrated in FIG. 2 to be obtained. The next steps of the fabrication process, such as the siliciding of the source, drain and control gate regions, are similar to those of a conventional CMOS process. It should be noted here that in FIG. 11 the substrate ISB and the epitaxial silicon ESR together form the substrate SB in which the floating gate SCS lies. The floating gate is isolated from the subjacent channel region and from the source and drain regions by the oxide OX1.

Figure 12:
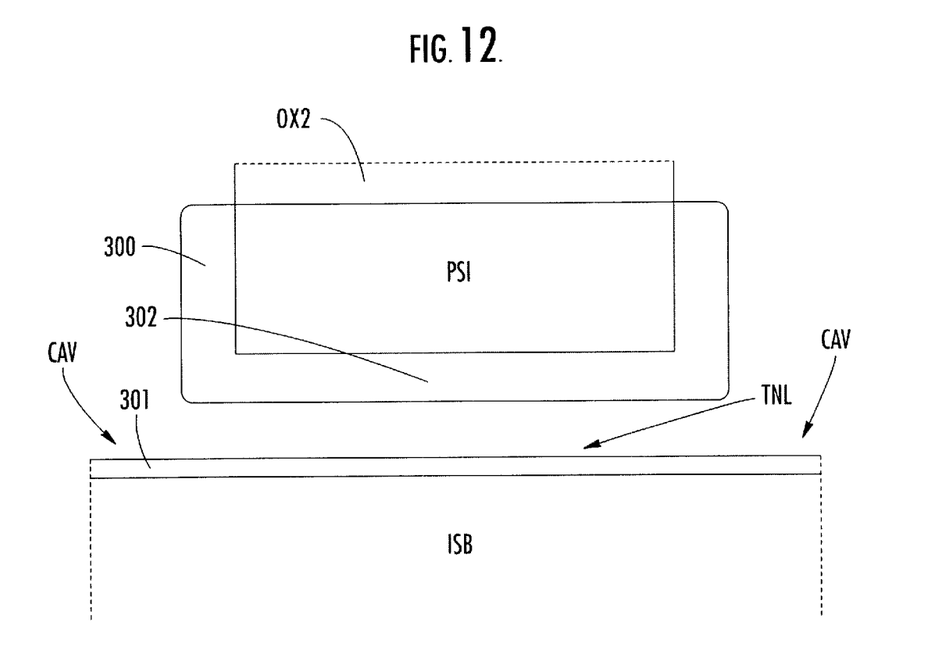
FIGS. 12 to 14 are cross-sectional views illustrating a second alternative method according to the invention.

FIG. 12 illustrates a step of oxidizing the tunnel TNL that results only in the encapsulation of the walls of the tunnel. The inner remaining part of the tunnel TNL remains empty. More specifically, the oxide layer grows thermally on the single-crystal block SCS and on the initial substrate ISB. As explained above, the thickness of the oxide layer 301 having grown on the initial substrate ISB is less than the thickness of the oxide layers 300 and 302 having grown in contact with the highly doped silicon SCS.

Figure 13:
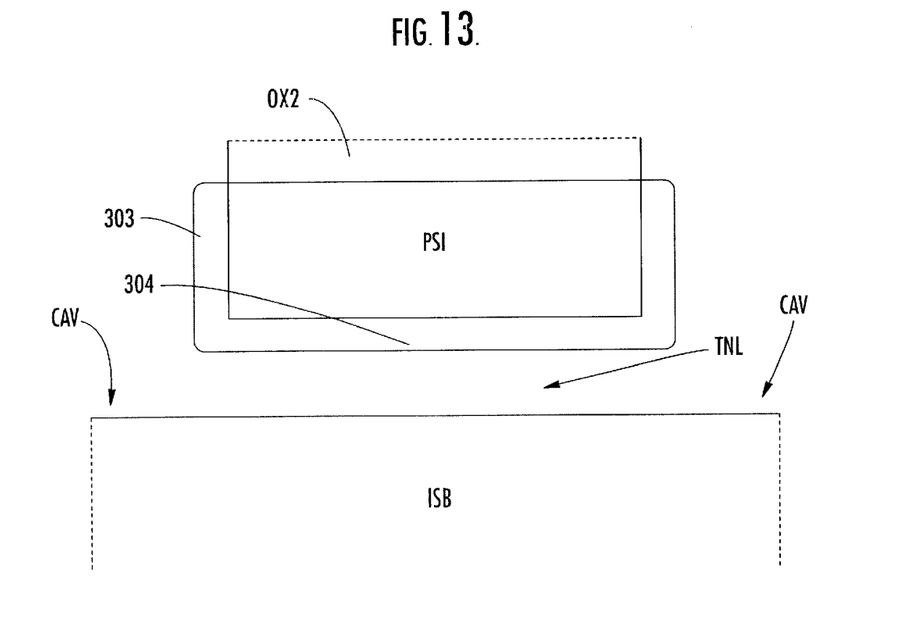

Deoxidation of the bottoms of the cavities CAV by a wet chemistry then results in the structure illustrated in FIG. 13. The silicon block SCS remains surrounded by insulating oxide layers 303 and 304, although these are thinner than the initial layers 300 and 302. On the other hand, the cavities CAV have been completely deoxidized together with the lower wall of the tunnel.

Figure 14:
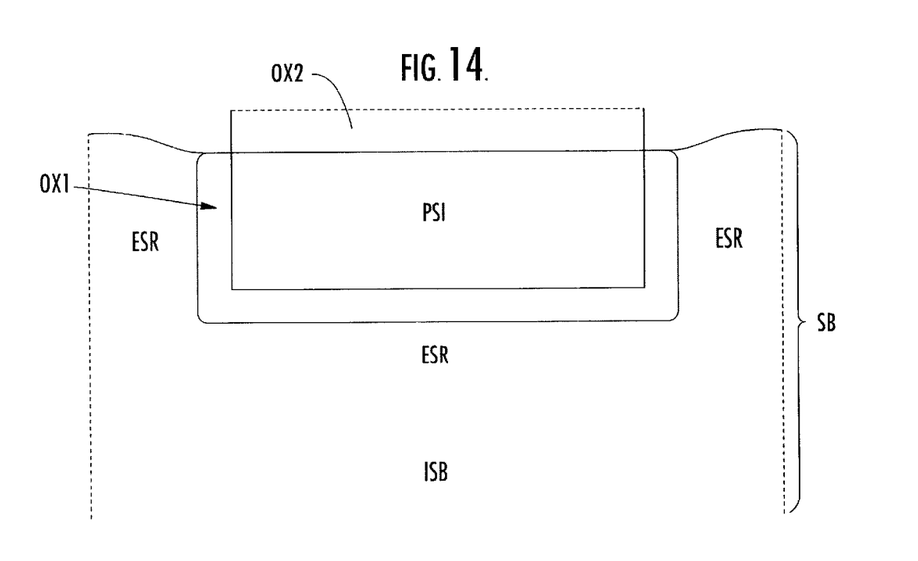

The next step is similar to that described with reference to FIG. 11. More specifically, as illustrated in FIG. 14, silicon is grown in the cavities CAV to obtain epitaxial silicon regions ESR. These regions ESR complete the substrate ISB to encapsulate, on the one hand, the silicon block SCS isolated by the oxide OX1 and, on the other hand, to penetrate into the tunnel TNL.

Here again, as illustrated in FIG. 14, a point memory structure similar to that schematically illustrated in FIG. 2 is obtained. It should be noted that if, in the structure illustrated in FIG. 12, an anisotropic plasma etching operation had been carried out to deoxidize the bottoms of the cavities CAV instead of using wet chemistry, some oxide would have remained on the lower wall of the tunnel TNL. The final result would therefore be a memory structure as illustrated in FIG. 3 after the epitaxial silicon growth in the cavities and inside the tunnel. That is, a channel region would be confined in its upper part and in its lower part by two isolating regions.

Figure 15:
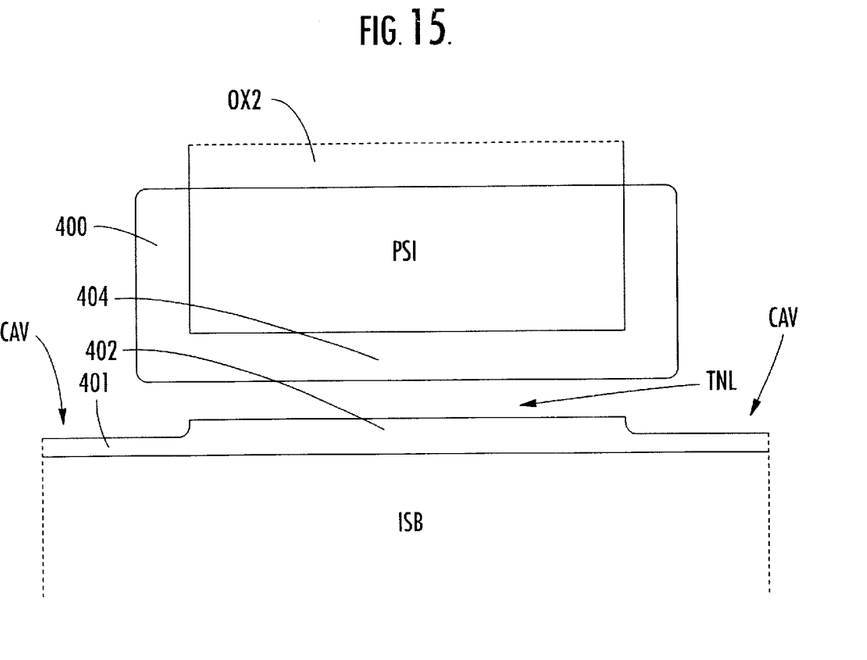
FIGS. 15 to 17 are cross-sectional views illustrating a third alternative method according to the invention.
Figure 16:
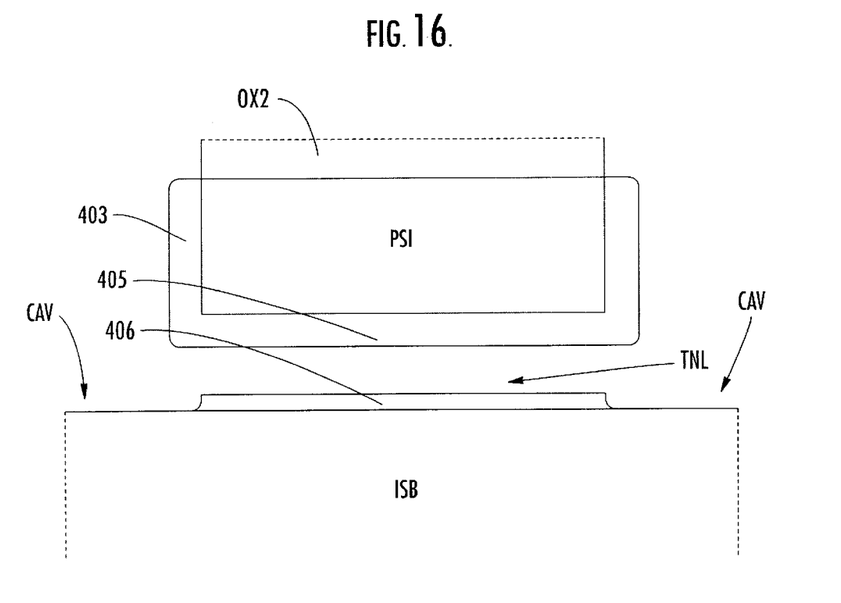
Figure 17:
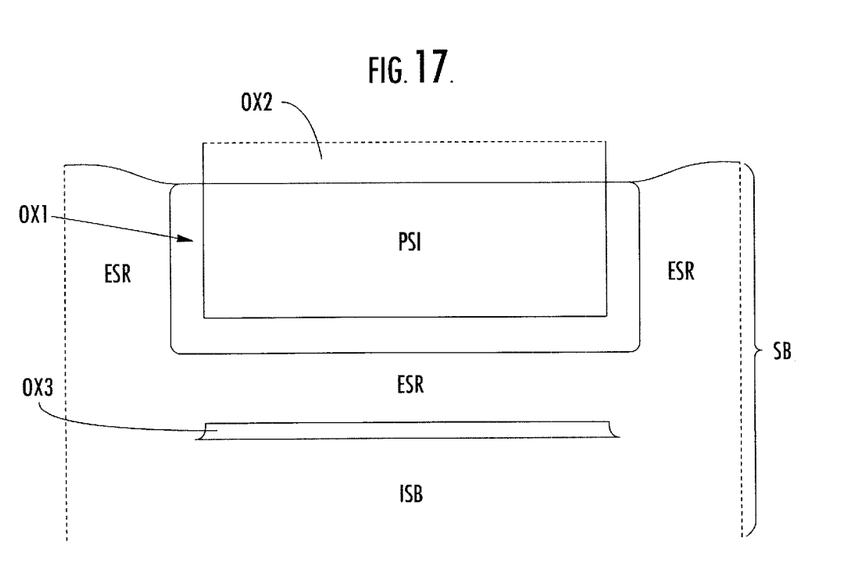

As will now be seen in greater detail with reference to FIGS. 15 to 17, it is also possible to obtain a memory device structure according to that illustrated in FIG. 3 by deoxidizing the bottoms of the cavities CAV using a wet bath chemistry. However, it is then necessary, before carrying out the step of oxidizing the tunnel TNL, for the cavities CAV to undergo ion implantation. This may be done with nitrogen ions, for example, and the ion implantation retards the oxidation of the silicon. Consequently, during the subsequent tunnel oxidation step, the oxide 402 inside the tunnel will grow with a greater thickness than the oxide 401 at the bottom of the cavities. It should be noted here that the spacers (not shown in FIG. 15) lying on each side of the control gate CG serve as a mask for the nitrogen implantation.

Of course, as explained above, some oxide 400 and 404 also grows in contact with the block SCS to a greater thickness than that of the oxide 401. The process may then continue, as illustrated in FIG. 16, with deoxidation by wet chemistry resulting in an oxide layer 403 and 405 being left around the block SCS. Also, an oxide layer 406.results on the lower wall of the tunnel TNL. The process then continues, as illustrated in FIG. 17, with the growth of silicon in the cavities. This results in the formation of the epitaxial silicon region ESR penetrating the tunnel TNL and coating the block SCS. The channel region is then formed by the epitaxial silicon region ESR located between the oxide layer OX1 and the oxide layer OX3.

The operation of a memory device according to the invention, whether the one illustrated in FIG. 2 or the one illustrated in FIG. 3, does not differ from the conventional operation of a FLASH, EEPROM or EPROM point memory. Moreover, in the case of very small dimensions, such as for point memories having structures on the order of 10 nm×10 nm or 20 nm×20 nm, for example, the structure according to the invention can also operate as a one-electron memory. The passage of a single electron in the floating gate thus prevents the arrival of the following electrons by the Coulomb blocking mechanism.

More specifically, the electron stored in the floating gate creates a repulsive action with respect to the following electrons and, because of the very small dimensions of the low gate-channel capacitive coupling, the difference of one electron is sufficient to change the threshold voltage of the transistor considerably. Such a one-electron memory is less sensitive to aging since a smaller number of electrons cross the gate oxide.

Additionally, the process according to the invention makes it possible to easily obtain a thinner gate oxide between the floating gate and the channel region than the gate oxide separating the two gates. This is particularly advantageous for non-volatile memories.

That which is claimed is:

1. A method for fabricating a semiconductor non-volatile memory device comprising:
   forming a first layer on a silicon substrate that is selectively removable with respect to the silicon substrate;
   forming an isolation region surrounding the first layer;
   forming a second layer on the first layer comprising silicon and having a higher dopant concentration than the silicon substrate;
   forming a gate oxide layer on the second layer;
   forming a control gate on the gate oxide layer having two opposed ends in contact with the isolation region;
   etching the control gate, the gate oxide layer, the second layer, the first layer, and an upper part of the silicon substrate along two opposed sidewalls to form cavities;
   selectively etching the first layer to form a tunnel between the second layer and the silicon substrate;
   insulating the second layer by forming an insulating layer on the sidewalls of the second layer and in at least part of the tunnel;
   filling the cavities with silicon; and
   forming source and drain regions in the filled cavities on each side of the second etched layer to define a floating gate.

2. The method according to claim 1 wherein insulating comprises coating interior walls of the tunnel with the insulating layer and leaving the tunnel empty.

3. The method according to claim 1 wherein insulating comprises completely filling the tunnel with the insulating layer.

4. The method according to claim 1 wherein insulating comprises:
   forming the insulating layer in a bottom of the cavities; and
   removing portions of the insulating layer from the bottom of the cavities before filling the cavities with silicon.

5. The method according to claim 4 wherein removing comprises removing portions of the insulating layer by anisotropic etching.

6. The method according to claim 4 wherein removing comprises removing portions of the insulating layer by chemical etching in a wet bath.

7. The method according to claim 4 wherein insulating comprises coating walls of the tunnel with the insulating layer and leaving the tunnel empty; and further comprising implanting ions in the bottom of the cavities to retard oxidation of the silicon and to provide a thinner insulating layer in the bottom of the cavities than inside the tunnel after insulating.

8. The method according to claim 1 wherein filling comprises growing the silicon by selective epitaxy.

9. The method according to claim 1 wherein filling further comprises filling the tunnel with silicon.

10. A method for fabricating a semiconductor device comprising:
    forming a first layer on a silicon substrate that is selectively removable with respect to the silicon substrate;
    forming a second layer on the first layer comprising silicon and having a higher dopant concentration than the silicon substrate;
    forming a gate oxide layer on the second layer;
    forming a control gate on the gate oxide layer;
    removing portions of the control gate, the gate oxide layer, the second layer, the first layer, and an upper part of the silicon substrate along two opposed sidewalls to form cavities;
    selectively removing portions of the first layer to form a tunnel between the second layer and the silicon substrate;
    insulating the second layer by forming an insulating layer on the sidewalls of the second layer and in at least part of the tunnel;
    filling the cavities with silicon; and
    forming source and drain regions in the filled cavities on each side of the second etched layer to define a floating gate.

11. The method according to claim 10 further comprising forming an isolation region surrounding the first layer prior to forming the gate oxide layer, and wherein forming the control gate comprises forming the control gate to have two opposing ends in contact with the isolation region.

12. The method according to claim 10 wherein removing and selectively removing comprise etching.

13. The method according to claim 10 wherein insulating comprises coating interior walls of the tunnel with the insulating layer and leaving the tunnel empty.

14. The method according to claim 10 wherein insulating comprises completely filling the tunnel with the insulating layer.

15. The method according to claim 10 wherein insulating comprises:
    forming the insulating layer in a bottom of the cavities; and
    removing portions of the insulating layer from the bottom of the cavities before filling the cavities with silicon.

16. The method according to claim 15 wherein removing portions of the insulating layer comprises removing portions of the insulating layer by anisotropic etching.

17. The method according to claim 15 wherein removing portions of the insulating layer comprises removing portions of the insulating layer by chemical etching in a wet bath.

18. The method according to claim 15 wherein insulating comprises coating walls of the tunnel with the insulating layer and leaving the tunnel empty; and further comprising implanting ions in the bottom of the cavities to retard oxidation of the silicon and to provide a thinner insulating layer in the bottom of the cavities than inside the tunnel after insulating.

19. The method according to claim 10 wherein filling comprises growing the silicon by selective epitaxy.

20. The method according to claim 10 wherein filling further comprises filling the tunnel with silicon.

* * * * *